United States Patent [19]

Morimoto et al.

[11] Patent Number: 4,559,901
[45] Date of Patent: Dec. 24, 1985

[54] ION BEAM DEPOSITION APPARATUS

[75] Inventors: Kiyoshi Morimoto, Mobara; Toshinori Takagi, Nagaokakyo, both of Japan

[73] Assignee: Futaba Denshi Kogyo K.K., Mobara, Japan

[21] Appl. No.: 696,518

[22] Filed: Jan. 30, 1985

[30] Foreign Application Priority Data

Jan. 31, 1984 [JP] Japan .................................. 59-15731
Mar. 26, 1984 [JP] Japan .................................. 59-59000

[51] Int. Cl.⁴ ............................................ C23C 13/08
[52] U.S. Cl. ...................................... 118/723; 427/38
[58] Field of Search ........................... 118/723; 427/38

[56] References Cited

U.S. PATENT DOCUMENTS 4,451,499 5/1984 Morimoto et al. ............. 118/723 X

Primary Examiner—James R. Hoffman
Attorney, Agent, or Firm—Oblon, Fisher, Spivak, McClelland & Maier

[57] ABSTRACT

An ion beam deposition apparatus capable of uniformly distributing an ionized vaporized material on a desired area of a substrate is disclosed. The apparatus includes an accelerating electrode and a deflecting electrode each arranged between an ionization region and a substrate.

8 Claims, 27 Drawing Figures

ION BEAM DEPOSITION APPARATUS

BACKGROUND OF THE INVENTION

1. Field of the Invention

This invention relates to an ion beam deposition apparatus, and more particularly to an ion beam deposition apparatus which is adapted to impart kinetic energy to a vaporized material ionized in an ionization region and transport the ionized vaporized material to a substrate together with non-ionized vaporized material to uniformly deposit the materials on the substrate.

2. Description of the Prior Art

A vapor deposition film has been conventionally prepared using ion plating techniques, ion beam deposition techniques or cluster ion beam deposition techniques. Such deposition techniques each are to ionize a material of which the vapor deposition film is to be formed and apply acceleration voltage to the ionized material or utilize the charge effect of the ionized material as well as the application of the voltage to impart kinetic energy thereto, to thereby control the crystallizability and other physical properties of the deposited film.

In the conventional deposition techniques, it is required to provide an accelerating electrode adjacent to the crucible which serves to accelerate a vaporized material ejected from a crucible and ionized by the collision with an electron shower.

Figure 1:
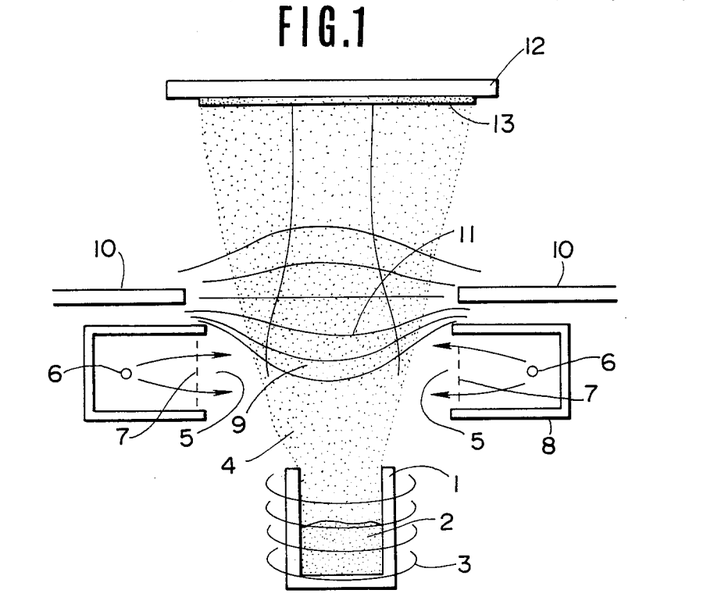
FIG. 1 is a front view showing a conventional ion beam deposition apparatus.

For example, the ion beam deposition techniques are practiced using such an apparatus as shown in FIG. 1. More particularly, a material 2 to be deposited is charged in a crucible 1 and then the crucible is heated. The heating of the crucible may be carried out by a radiation heating method using radiation heat generated from a crucible heating filament 3, an electron impact type heating method using electrons emitted from the filament 3 by applying voltage between the filament 3 and the crucible 1, or a direct heating method wherein electrical current is flowed directly through the outer surface of the crucible 1. Alternatively, the heating may be carried out by any combination of the above-mentioned heating methods. The heating of the crucible 1 causes the material to be changed to a vapor 4, which usually comprises microaggregates constituted by several molecules or atoms.

Then, an electron shower 5 is entangled in or collided with the vapor 4 to ionize a part of the vapor. The electron shower 5 is formed by cooperation of a filament 6 for emitting ionization electrons and a mesh-like grid 7 for deriving the electrons from the filament 5. In order that the electron shower 5 may be effectively directed toward the vapor 4, the filament 6 is conventionally surrounded by a shielding electrode 8 having the same potential as the filament 6 and the grid 7 is applied thereto voltage of 200 V to 1 kV positive with respect to the filament 6 and shielding electrode 8. Such construction is applied to the positive ionization of atoms or molecules due to ionization. The filament 6, grid 7 and shielding electrode 8 constitute an ionization electrode group, and the collision of the electron shower 5 with the vapor 4 upward ejected from the crucible 1 is carried out in an ionization region 9.

The particles of the ionized vapor are positively charged. Accordingly, in order to accelerate the ionized particles to impart kinetic energy thereto, it is required to provide an accelerating electrode 10 to apply negative acceleration voltage of 0–10 kV.

Equipotential lines 11 of the applied voltage, as shown in FIG. 1, are distributed in a concave form within the ionization region 9 when viewing from the upper side and the ionized particles are gradually accelerated while being applied thereto a force perpendicular to the equipotential lines 11 so that the ionized particles are converged about the central axis. FIG. 1 also shows that the equipotential lines 11 existing at the upper area of the ionization region are distributed in a convex form to be diverged. However, the particles are transported at a high velocity through the area because of having been already accelerated. Thus, the equipotential lines are converged. Further, high negative voltage applied or voltage optimum for forming a deposited film which is determined depending upon the applications causes a degree of convergence to be significantly varied.

A part of the vaporized particles which has not been ionized in the ionization region 9 reaches a substrate 12 for deposition without being accelerated and converged.

This causes the ionized and accelerated particles to be predominantly distributed on the central region of the substrate 12 and inferiorly distributed on the periphery thereof, resulting in a film deposited on the substrate being non-uniform.

Such phenomenon appears in not only the ion beam deposition techniques using such an apparatus as shown in FIG. 1 and utilizing the ionized molecule or aromlike particles but also cluster ion beam deposition techniques utilizing atom aggregates each formed of about 500–2000 atoms loosely bonded together.

The cluster ion beam deposition techniques will be hereinafter described in connection with an apparatus shown in FIG. 2.

The cluster ion beam deposition techniques utilize adiabatic expansion due to ejection. For this purpose, a material 16 to be deposited is charged in a crucible 15 provided with an injection nozzle 14. The crucible 15 is heated by a heating method of the electron impact type using electrons emitted from a filament 17 to vaporize the material 16. Alternatively, the heating of the crucible 15 may be carried out by a direct heating method utilizing large current flowed through the wall of the crucible 15, a heating method by means of a heater disposed around the crucible 15 or a combination thereof.

When the material 16 which has been vaporized in the crucible 15 to form a vapor having high pressure of the order of $10^{-2}$ to several Torr is ejected from the crucible 16 through the nozzle 16 to a high vacuum region, it forms atom aggregates each formed of 500–2000 atoms or clusters by supercooling due to adiabatic expansion and is transported toward a substrate in the form of a cluster beam 18 with kinetic energy imparted thereto at the time of the ejection from the nozzle 14. In the course of the ejection, an electron shower is formed by cooperation of a filament 19 for emitting electrons necessary for ionization of the clusters and positive voltage of about 200 V–1 kV which is applied to a mesh-like grid 20 for deriving electrons from the filament 19, as in FIG. 1. The electron shower thus formed is effectively irradiated on the cluster stream 18 with the assistance of a shielding electrode having the same potential as the filament 19 to ionize a part of the clusters. Such ionization is carried out in an ionization region 22. In FIG. 2, reference numerals 23, 24 and 25 designate an accelerating electrode, a substrate holder and a substrate, respectively. The apparatus shown in FIG. 1 may be provided with a thermo-couple 26, a heater 27 for heating the substrate 25 and a shutter 28, as desired depending upon the applications.

In such a case, the ionization of each of the clusters is carried out with respect to at least one of 500-2000 atoms constituting the cluster. In order to accelerate the ionized clusters, an electrical field produced by the accelerating electrode 23 enters or penetrates into the ionization region 22 to form a convergent lens system. This is accomplished in the substantially same manner as in FIG. 1. This causes the ionized clusters to be converged or focused about the central axis by the acceleration voltage. Thus, a film deposited on the substrate 25 supported on the substrate holder 24 is formed of clusters ionized in the ionization region 22 and subjected to the converging or focusing action and neutral clusters non-ionized and straightly transported to the substrate 25 which are non-uniformly distributed to each other. The distribution of the ionized clusters and non-ionized clusters is varied every variation in acceleration voltage depending upon the applications.

Figure 2:
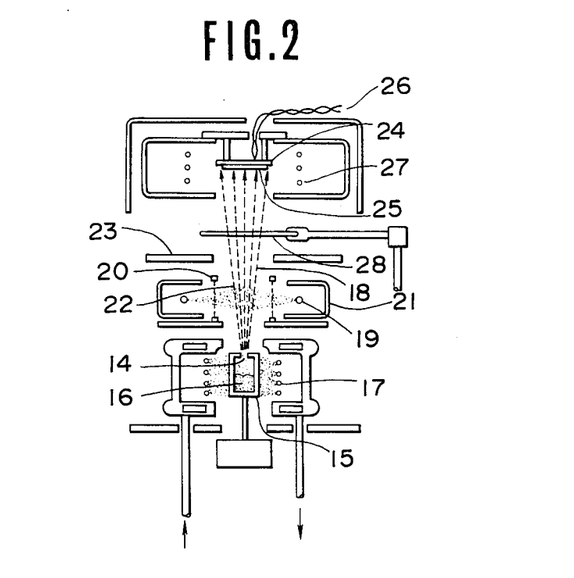
FIG. 2 is a front view showing another conventional ion beam deposition apparatus.

FIG. 3 illustrates examples of a computer simulation of such phenomenon in the apparatus of FIG. 2. The computer simulation of FIG. 3 was obtained using clusters of silver, wherein the portion from the ionization region 22 to the substrate 25 in FIG. 2 is enlargedly shown.

In the apparatus shown in FIG. 2, it is required to apply electron deriving voltage of 200 V-1 kV between the ionization electron deriving grid 20 and the ionization electrode emitting filament 19. In light of this respect, in FIG. 3, the electron deriving voltage is set to be 500 V, voltage to be applied to an ionization electron deriving grid 20 corresponding to the grid 20 in FIG. 2 is set to be 0 V and voltage to be applied to an ionization electron emitting filament 19 corresponding to the filament 19 in FIG. 3 is set to be $-500$ V.

Figure 3A:
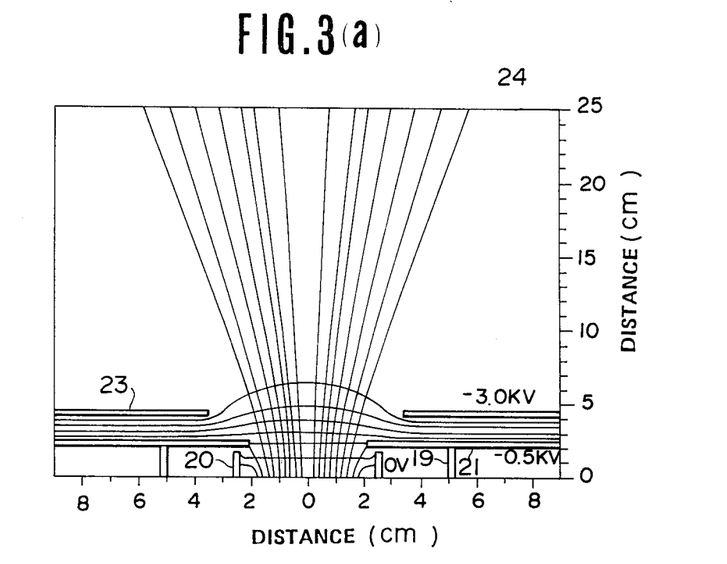
FIGS. 3(a), 3(b), 3(c) and 3(d) are diagrammatic views showing examples of a computer simulation in the deposition apparatus shown in FIG. 2.
Figure 3B:
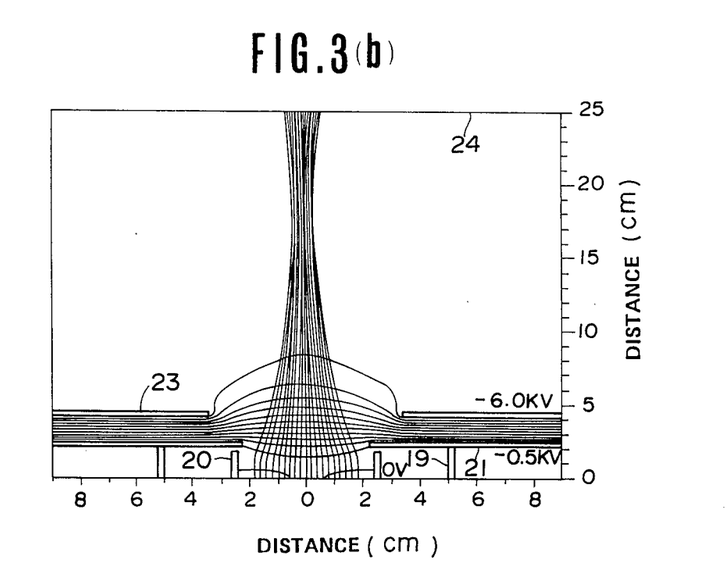
Figure 3C:
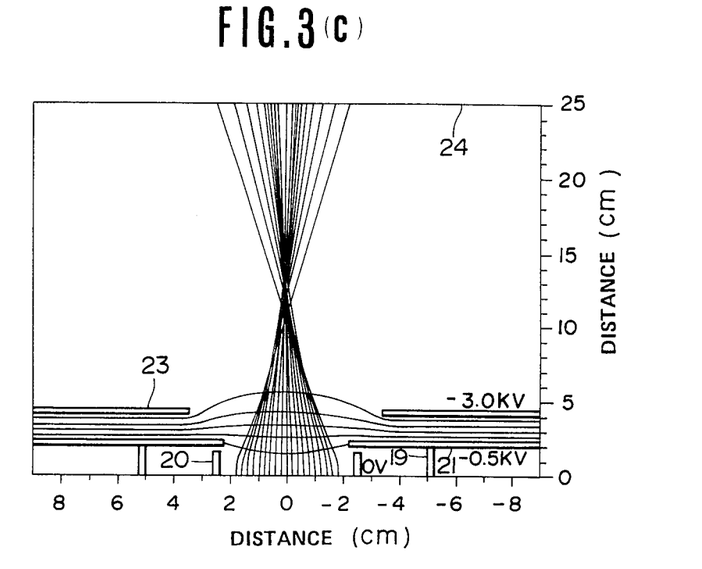
Figure 3D:
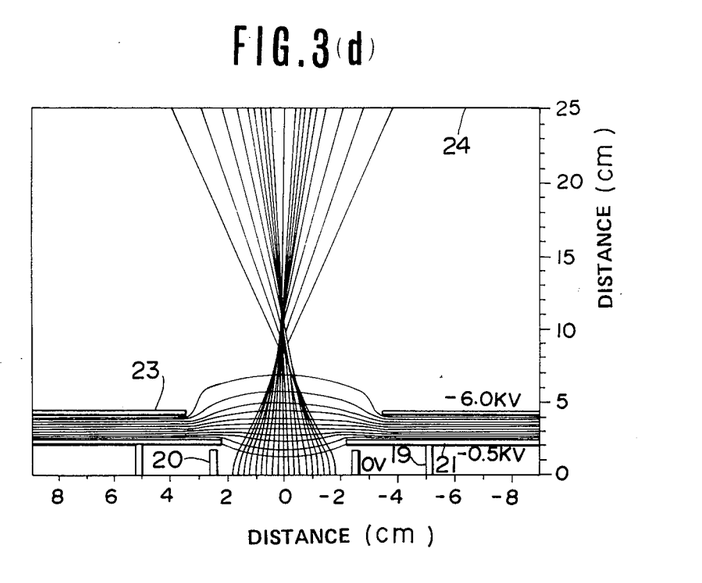

FIG. 3A shows trails of the ionized clusters obtained by applying voltage of $-3$ kV to an accelerating electrode 23 in FIG. 3 corresponding to the electrode 23 in FIG. 2, and FIG. 3B shows those obtained by applying voltage of $-6$ kV thereto.

As can be seen from FIGS. 3A and 3B, the distribution of the ionized clusters on a substrate 25 is significantly varied depending upon voltage applied to the accelerating electrode 23 in FIG. 3.

As described above in connection with FIG. 2, the penetration of the electrical field of the acceleration voltage into the ionization region 23 causes the convergence of the clusters. However, in the simulation shown in FIG. 3, particularly, FIG. 3A, the ionized clusters are not sufficiently converged. The reason seems to be as follows:

A program used for the simulation shown in FIG. 3 is prepared using the latest and extremely high techniques and is highly different from a program for a simulation prepared in view of only the divergence and convergence of clusters due to the electrical field of acceleration voltage. Supposing that a conventional program is used which is prepared in view of only the electrical field, the simulations shown in FIGS. 3A and 3B respectively have trails of ionized clusters as shown in FIGS. 3C and 3D which are converged and then diverged.

In the preparation of the program used for the simulations shown in FIGS. 3A and 3B, the space charge effect of the ionized clusters has been carefully considered as well. Thus, the trails of the ionized clusters in the simulations shown in FIGS. 3A and 3B are converged in view of the repelling action between the ionized clusters and the micro variation in space potential due to the charge of the ionized clusters. Accordingly, the simulations of FIGS. 3A and 3B are highly close to the real state. This indicates that the trails of the ionized clusters can be pursued even when the variation in ionization current causes the variation in amount of ionized particles.

However, neutral clusters which have not been subjected to ionization are not affected by the acceleration voltage. Thus, the proportion between the neutral clusters and the ionized clusters distributed on the substrate is non-uniform. This adversely affects the crystallizability and physical properties of a film deposited on the substrate.

SUMMARY OF THE INVENTION

The present invention has been made in view of the foregoing disadvantages of the prior art.

Accordingly, it is an object of the present invention to provide an ion beam deposition apparatus which is capable of uniformly distributing ionized vaporized material on a desired area of a substrate.

It is another object of the present invention to provide an ion beam deposition apparatus which is capable of forming a uniform film on a substrate and/or forming a desired film on a desired area of a substrate.

In accordance with the present invention, there is provided an ion beam deposition apparatus comprising an ionization region in which at least a part of a vaporized material is ionized and kinetic energy is imparted to the ionized vaporized material to transport the ionized vaporized material together with non-ionized vaporized material to a substrate, to thereby deposit the materials on the substrate; an accelerating electrode arranged between the ionization region and the substrate for imparting necessary kinetic energy to the ionized vaporized material when the ionized vaporized material reaches the substrate; and a means arranged between the ionization region and the substrate for providing the ionized vaporized material of a uniform concentration over a desired area of the substrate or uniformly distributing the ionized vaporized material over the area.

BRIEF DESCRIPTION OF THE DRAWINGS

Other objects and many of the attendant advantages of the present invention will be readily appreciated as the same becomes better understood by reference to the following detailed description when considered in connection with the accopanying drawings, wherein.

DETAILED DESCRIPTION OF THE PREFERRED EMBODIMENT

Now, an ion beam deposition apparatus according to the present invention will be described hereinafter with reference to FIGS. 4 to 16.

Figure 4:
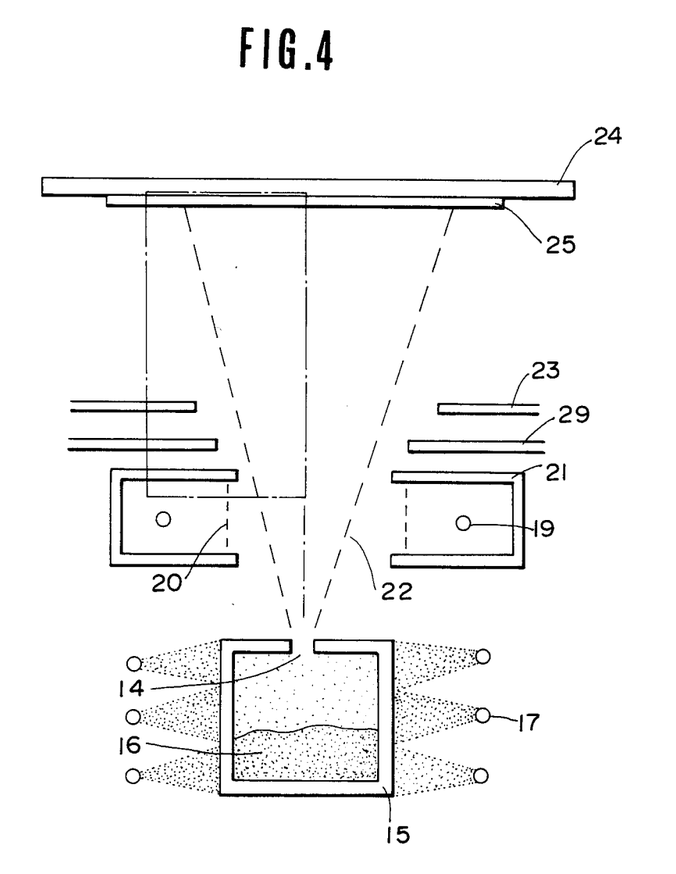
FIG. 4 is a front view showing one embodiment of an ion beam deposition apparatus according to the present invention.

FIG. 4 shows one embodiment of an ion beam deposition apparatus according to the present invention, wherein the same reference numerals as in FIG. 2 designate like or corresponding parts thereof. The apparatus shown in FIG. 4 is different from that shown in FIG. 2 in that an intermediate electrode 29 for acceleration and deceleration is arranged between a shielding electrode 21 and an accelerating electrode 23.

A study on the convergence of ionized clusters was carried out using the vapor deposition apparatus shown in FIG. 4 by applying acceleration voltage determined depending upon the applications to the accelerating electrode 23 and varying voltage of the intermediate electrode 29.

Figure 5:
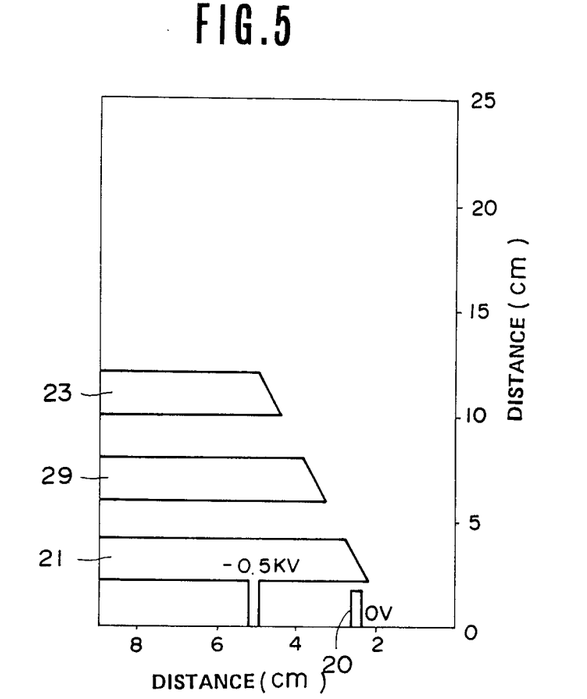
FIG. 5 is a schematic view showing a model of a part of the apparatus shown in FIG. 4.

Also, in the study, the above-described ion trail simulation system was used wherein the space-charge effect of ionized clusters and the variation in space potential due to the charge of the ionized clusters were considered as well. In the study, the area indicated by dashed lines in FIG. 4 was extracted and modeled as shown in FIG. 5.

Further conditions for the study were that energy at the time of ejection of a vaporized material from the nozzle was considered as one of the initial conditions, cluster ionization current was 20 $\mu$A, and voltage applied to a substrate holder 24 and the accelerating electrode 23 and voltage applied to the intermediate electrode 29 were as shown in Table I.

TABLE I

Figure 6:
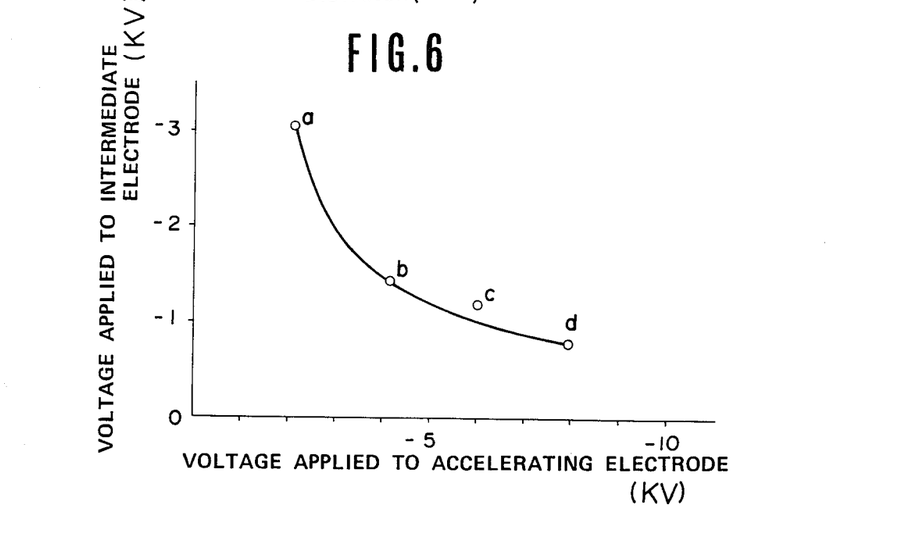
FIG. 6 is a graphical representation showing the relationship between voltage of an acceleration electrode and that of an intermediate electrode.

| | Voltage Applied to Accelerating Electrode 23 and Substrate Holder 24 | Voltage Applied to Intermediate Electrode 29 |
| --- | --- | --- |
| FIG. 6(a) | −2kV | −3kV |
| FIG. 6(b) | −4kV | −1.4kV |
| FIG. 6(c) | −6kV | −1.2kV |

TABLE I-continued

| | Voltage Applied to Accelerating Electrode 23 and Substrate Holder 24 | Voltage Applied to Intermediate Electrode 29 |
| --- | --- | --- |
| FIG. 6(d) | −8kV | −0.8kV |

The study was made on the trail of ionized cluster under the above-described conditions, and FIG. 6 shows the relationships between voltage applied to the accelerating electrode 23 (which is the same as voltage applied to the substrate holder 24) and voltage applied to the intermediate electrode 29 which were obtained from results of the study.

The embodiment shown in FIG. 4, as described above, is constructed in the manner that the accelerating electrode 23 and intermediate electrode 29 allow desired kinetic energy to be imparted to the ionized vaporized material and the material to be uniformly distributed on a desired area of the substrate. Alternatively, the apparatus may be provided with two or more intermediate electrodes 29.

Now, another embodiment of the present invention will be described with reference to FIG. 7.

Figure 7:
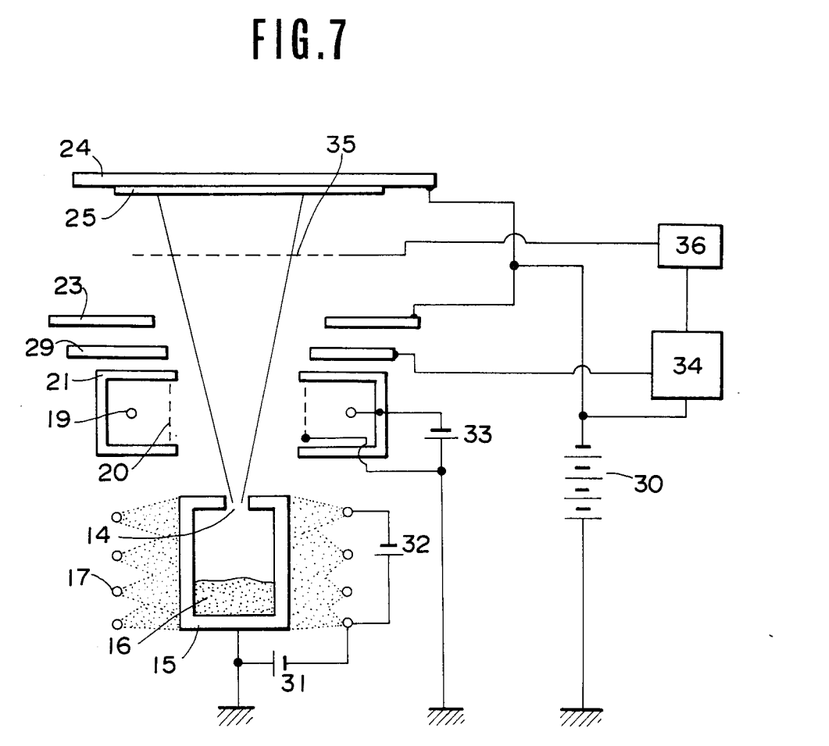
FIG. 7 is a front view showing another embodiment of an ion beam deposition apparatus according to the present invention.

In FIG. 7, the same reference numerals as in FIG. 4 designate like or corresponding parts thereof. In the apparatus shown in FIG. 4, a crucible 15 is earthed, a substrate holder 24 and a rearmost accelerating electrode are applied thereto from a power source 30 voltage optimum for realizing the formation of a desired deposited film according to the results shown in FIG. 6. The heating of the crucible is carried out using electrons emitted from a filament 17 by means of a power source 17, and the heating of the filament 17 is carried out by means of a power source 32.

A vaporized material ejected through a nozzle 14 of the crucible 15 is transported to a substrate 25 in the form of clusters, during which an ionization electron deriving grid 20 causes an ionization electron emitting filament 19 to emit electrons so that a part of the clusters may be ionized. The filament 19 is heated by a suitable power source (not shown), and the derivation of electrons is carried out by a power source 33.

Thus, because the ionized clusters and neutral clusters are transported to the substrate 25 in a mixed state, voltage of a power source 34 is automatically or manually adjusted according to such previously determined relationships as shown in FIG. 6, to thereby obtain a desired distribution of the ionized clusters.

Further, the apparatus shown in FIG. 7 is provided with a beam profiler 35 which is adapted to be automatically or manually actuated to observe the profile of a beam of the ionized clusters or a cluster ion beam. Voltage of an intermediate electrode 29 is automatically or manually varied through the power source 34 to allow the ionized clusters to be uniformly distributed on the substrate 25 according to such relationships as shown in FIG. 6 while observing the beam profiler.

The beam profiler 36 may be any one of conventional types used for observing a beam profile, such as a bar-like beam profiler, a rectangular coordinate beam profiler, a Faraday cup type beam profiler or the like.

Furthermore, the apparatus of FIG. 7 is provided with a logic circuit 36 which is adapted to store a necessary ion distribution therein in advance and automatically judge a beam distribution data obtained from the beam profiler 35. The logic circuit 36 serves to automatically adjust the power source 34 in view of the beam distribution data and a signal from acceleration voltage of the power source 30 to obtain a desired cluster ion beam distribution.

FIGS. 8(a), 8(b), 8(c) and 8(d) show examples of a computer simulation in the apparatus shown in FIG. 7. The trails of ionized clusters shown in FIG. 8 were obtained under the conditions that voltage of the ionization electron deriving grid 20 was 0 V, voltage of the ionization electron emitting filament 19 was −500 V, and voltage applied to the accelerating electrode 23 and substrate holder 24 and voltage applied to the intermediate electrode 29 were as shown in Table II.

TABLE II

Figure 8A:
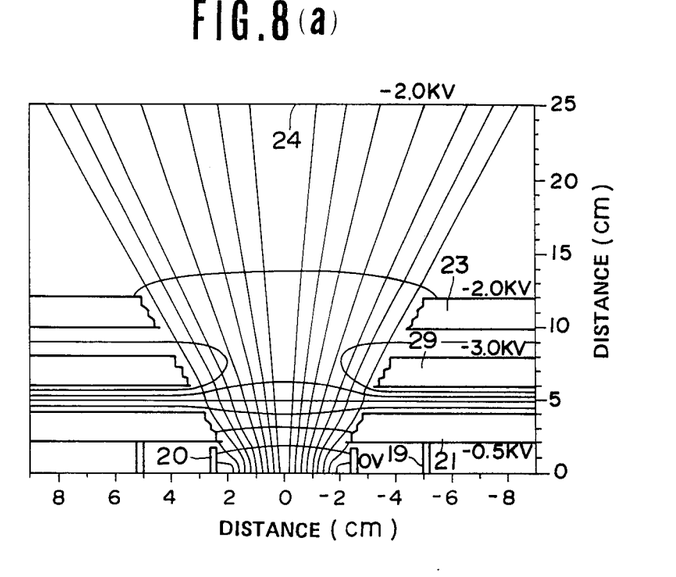
FIGS. 8(a), 8(b), 8(c) and 8(d) are diagrammatic view showing examples of a computer simulatiion of the apparatus shown in FIG. 7.
Figure 8B:
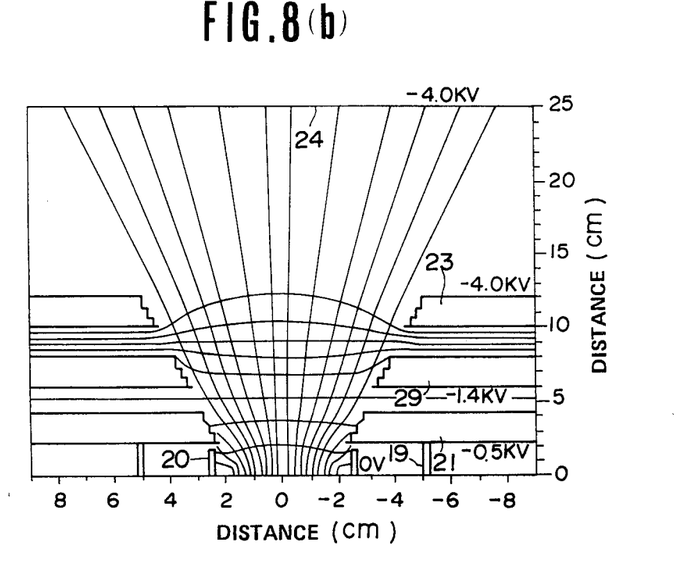
Figure 8C:
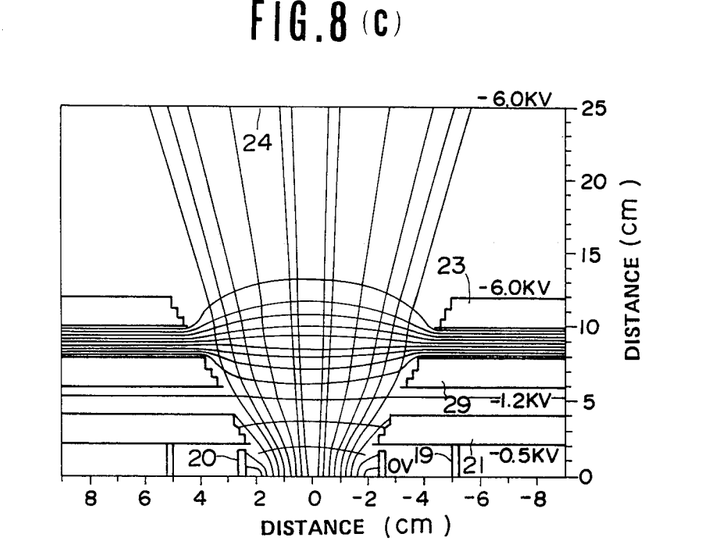
Figure 8D:
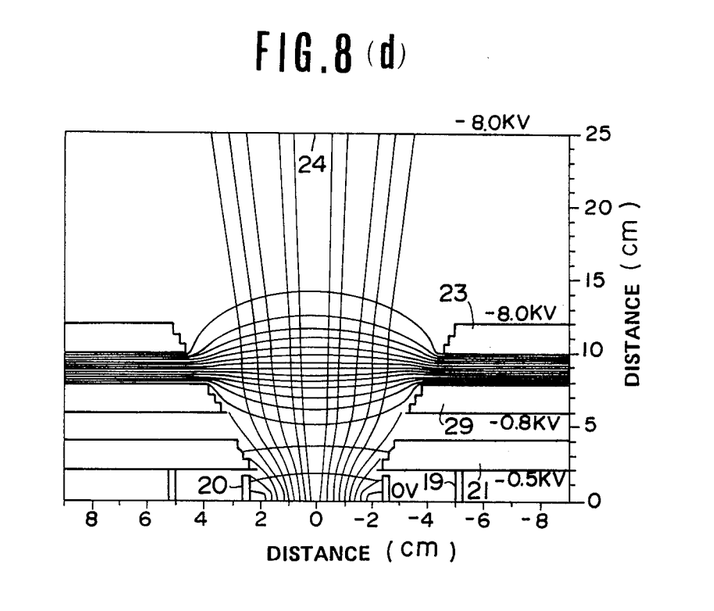

| | Voltage Applied to Accelerating Electrode 23 and Substrate Holder 24 | Voltage Applied to Intermediate Electrode 29 |
|---|---|---|
| FIG. 8(a) | −2kV | −3kV |
| FIG. 8(b) | −4kV | −1.4kV |
| FIG. 8(c) | −6kV | −1.2kV |
| FIG. 8(d) | −8kV | −0.8kV |

More particularly, the examples shown in FIG. 8 were obtained by applying to the rearmost accelerating electrode 23 voltage corresponding to kinetic energy required by the ionized clusters and concurrently controlling voltage applied to the intermediate electrode 29 based on a signal from the beam profiler 35 according to a predetermined program so that the ionized clusters having kinetic energy imparted thereto may be uniformly distributed over a desired area of the substrate 25 when the ionized clusters reach the substrate.

In FIG. 7, the crucible 15 is earthed. Alternatively, the substrate 25 may be earthed.

The above description on FIG. 7 is made in connection with the positive ionization of clusters. This is likewise applied to the negative ionization of clusters except that the polarity of voltage is varied.

The illustrated embodiment, as described above, is provided with the at least two electrodes which allow necessary kinetic energy to be imparted to the vaporized material ionized in the ionization region and the material of a uniform concentration to be provided over a desired area of the substrate or the material to be uniformly distributed over the area when the material reaches the substrate so that a uniform film may be formed on the substrate.

Alternatively, the present invention may be modified in such a manner that means for deflecting the ionized vaporized material is provided or arranged between the ionization region and the substrate in addition to the accelerating electrode to allow only the ionized vaporized material to be sensitive to deflecting voltage so that a uniform film may be deposited on the substrate even under the conditions of causing a non-uniform film to be formed thereon.

Now, another embodiment of the present invention which is constructed to deflect the ionized vaporized material will be described hereinafter with reference to FIG. 9.

Figure 9:
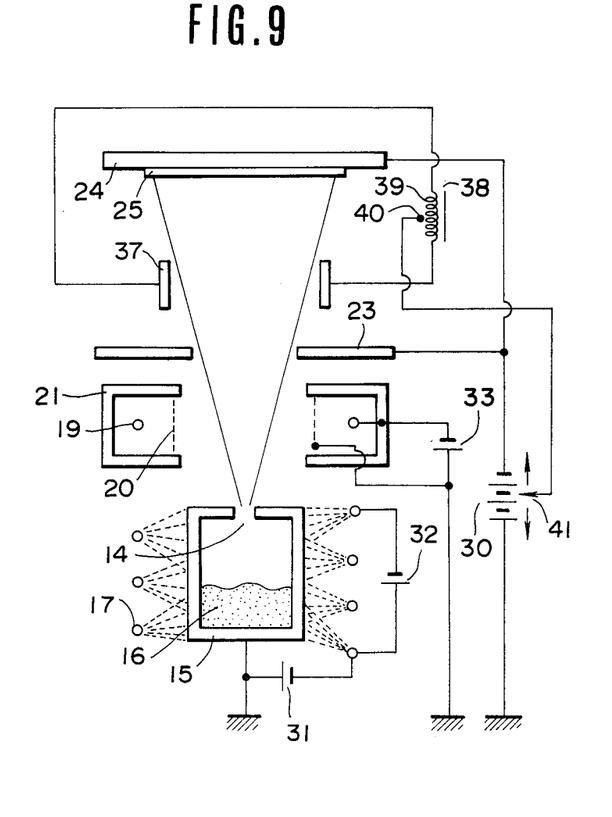
FIG. 9 is a front view showing another embodiment of an ion beam deposition apparatus according to the present invention.

In FIG. 9, the same reference numerals as in FIG. 7 designate like or corresponding parts. An ion beam deposition apparatus shown in FIG. 9 is different from that of FIG. 7 in that a deflecting electrode 37 is provided between an accelerating electrode 23 and a substrate 25.

In the apparatus shown in FIG. 9, a crucible 15 is earthed, and a substrate holder 24 and an accelerating electrode 23 are applied thereto from a power source 30 voltage optimum for realizing the formation of a film having desired characteristics. The heating of the crucible 15 is carried out using electrons emitted from a filament 17 by means of a power source 31, and the heating of the filament 17 is carried out by means of a power source 32.

A vaporized material ejected from a nozzle 14 of the crucible 15 is transported to the substrate in the form of clusters, during which an ionization electron deriving grid 20 causes electrons to be emitted from an ionization electron emitting filament 19, to thereby ionize the clusters. The heating of the ionization electron emitting filament 19 is carried out by a suitable power source (not shown) and the derivation of electrons is carried out using a power source 33.

The ionized clusters and neutral clusters are transported to the substrate 25 in a mixed state, during which voltage of the power source 30 is automatically or manually adjusted.

The deflecting electrode 37 is applied thereto AC voltage through the secondary winding 39 of a transformer 38. An intermediate tap 40 of the winding 39 is connected to a variable tap 41 of the power source 30 to select reference potential of the intermediate tap or deflecting electrode between earth potential of the accelerating electrode 23 depending upon the position of the variable tap 41 to control the distribution of the ionized clusters and deflect the cluster ion beam by AC voltage of the transformer 38 superimposed thereon to control the characteristics of a film deposited on the substrate 25.

Deflecting frequency of the deflecting electrode 37 may be set to be commercial frequency or 60 Hz. Alternatively, it may be set above or below commercial frequency.

Figures 10A, 10B, 10C:
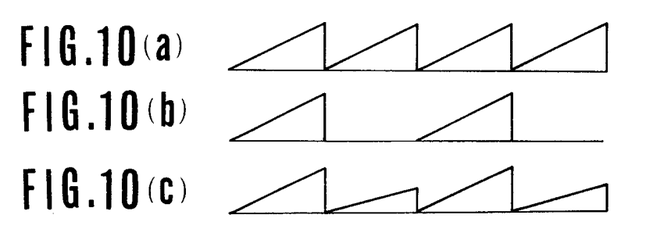
FIGS. 10(a), 10(b) and 10(c) each are a wave form chart of deflecting voltage.

The wave form of deflecting voltage of the deflecting electrode 37 may be swept in the form of a sawtooth waveform as shown in FIG. 10(a), consciously half swept as shown in FIG. 10(b) to prevent the transportation of ionized clusters to one half of a desired deposition area of the substrate 25, or swept as shown in FIG. 10(c).

Thus, it will be noted that, in the illustrated embodiment, the partial increase or decrease in amount of the ionized clusters in the mixture with the neutral clusters and the deposition of a film having a variable density according to a program are accomplished by varying the deflecting frequency and waveform of deflecting voltage of the deflecting electrode 37. Also, the illustrated embodiment can carry out the formation of a uniform film over a wide area of the substrate and/or the deposition of a film having desired physical properties, crystallizability and composition. Further, the embodiment can equivalently unify the distribution of the ionized clusters in the cluster ion beam even under the conditions of causing the clusters not to be uniformly distributed in the beam.

Now, one example of an experiment by the above-described embodiment will be described.

Figure 11A:
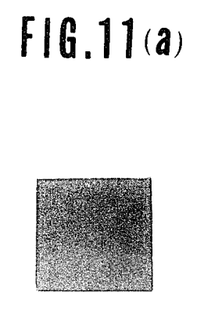
FIGS. 11(a) and 11(b) each are a microstructure view.
Figure 11B:
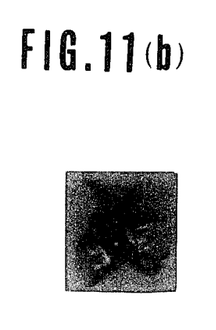

The procedure of the experiment was as follows:

The crucible 15 was charged therein with $MgF_2$. The deposition of a film on the substrate 25 formed of glass was carried out for 15 minutes under the conditions that current of 100 mA was flowed between the ionization electron emitting filament 19 and the electron deriving grid 20. Voltage of 10 kV was applied to the accelerating electrode 23 and commercial frequency was used as that for the deflecting electrode 37. The transformer 38 was applied thereto single-phase voltage of 150 V. Potential of the intermediate tap was set to be earthed potential. A temperature of the substrate holder 24 was set to be 320° C. The resultant film was a uniform magnesium fluoride film of a microstructure as shown in FIG. 11(a). A similar experiment was also carried out without using the deflecting electrode 37. A highly non-uniform film as shown in FIG. 11(b) was obtained.

Figure 12:
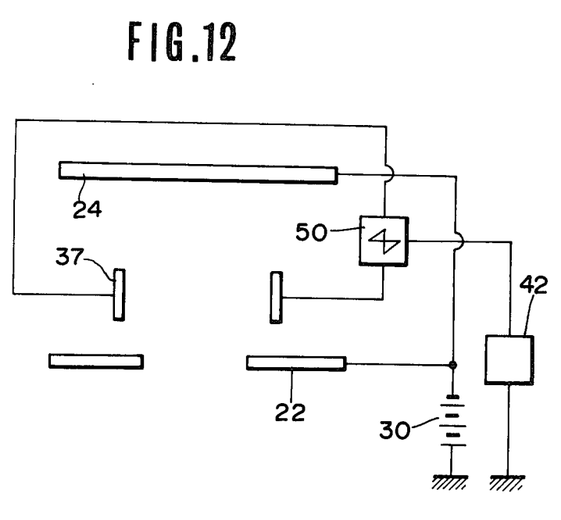
FIG. 12 is a front view showing the essential part of another embodiment of an ion beam deposition apparatus according to the present invention.

FIG. 12 shows the essential part of a further embodiment of the present invention.

The embodiment shown in FIG. 12 is constructed to have a functional voltage generator 41 substituted for the transformer 38 in FIG. 9, which is adapted to generate a sine wave, a triangular wave, and a sawtooth-wave. Reference potential is selected between earthed potential and potential of an accelerating electrode 23 through a voltage controller 50.

Figure 13:
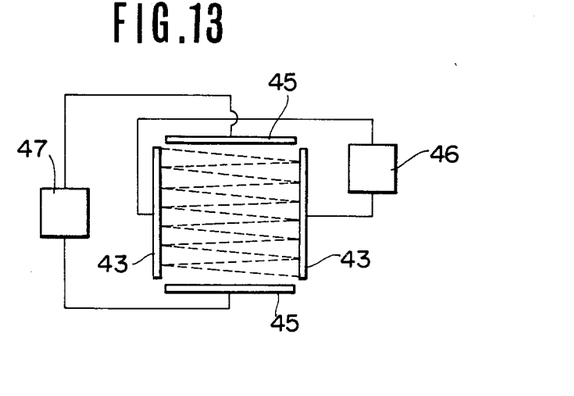
FIG. 13 is a plan view showing the essential portion of a further embodiment of an ion beam deposition apparatus according to the present invention.

Still a further embodiment of the present invention is shown in FIG. 13.

Figure 14:
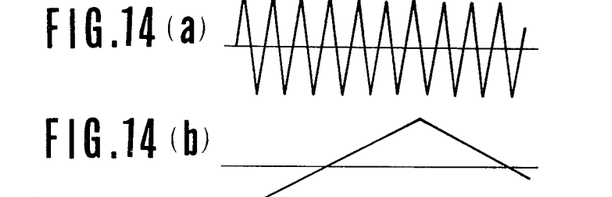
FIGS. 14(a) and 14(b) each are a wave form of deflecting voltage.

The embodiment has a pair of X-axis deflecting electrodes 43 arranged so as to be opposite to each other and a pair of Y-axis deflecting electrodes 45 arranged so as to be opposite to each other. The X-axis deflecting electrodes 43 are applied thereto output voltage of an X-axis deflecting voltage generating section 46 as shown in FIG. 14(a), and output voltage of a Y-axis deflecting voltage generating section 47 as shown in FIG. 14(b) is applied to the Y-axis deflecting electrodes 45 so that a cluster ion beam may be zigzag deflected.

Figure 15:
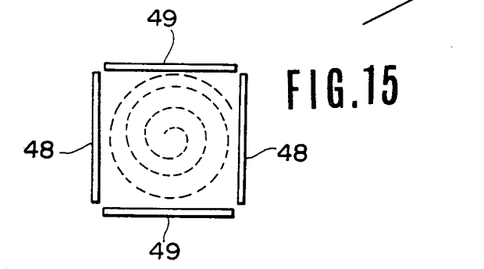
FIG. 15 is a plan view showing the essential part of still a further embodiment of an ion beam deposition apparatus according to the present invention.
Figure 16:
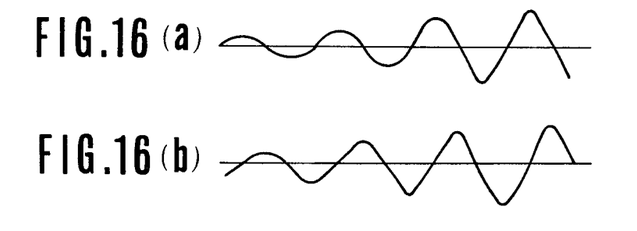
FIGS. 16(a) and 16(b) each are a wave form of deflecting voltage.

In still a further embodiment of which the essential part is shown in FIG. 15, a pair of X-axis deflecting electrodes 48 and a pair of Y-axis deflecting electrodes 49 are applied thereto voltages of a sine wave of which phases are different by 90° from each other and of which the crest values are gradually increased as shown in FIGS. 16(a) and 16(b), respectively.

The deflection of a cluster ion beam may be carried out by means of a magnetic field.

In the embodiments described above, the deflecting electrodes are provided between the accelerating electrode 23 and the substrate 25. However, those may be provided between the ionization region and the accelerating electrode.

The magnesium fluoride film obtained by the above-described experiment may be used as, for example, an optical coating for a laser reflecting mirror.

The present invention is also effectively applied to ZnO, Si, Au, Ag, GaAs, BeO, GaP and the like as well as $MgF_2$.

Further, when the ratio of ionized cluster to neutral clusters in the mixture therebetween is varied in the case that ZnO is used as a material to be deposited, the crystallizability of a deposited film is varied. More particularly, the increase in ratio of the ionized cluster to the neutral clusters results in a film preferentially oriented to a C-axis being formed on the glass substrate. Such film allows the damping factor of light to be partially controlled, to thereby provide new techniques for preparing an optical wave guard.

Obviously many modifications and variations of the present invention are possible in light of the above teachings. It is therefore to be understood that within the scope of the appended claims, the invention may be practiced otherwise than as specifically described.

What is claimed as new and desired to be secured by Letters Patent of the United States is:

1. An ion beam deposition apparatus comprising:
   an ionization region for ionizing at least a part of a vaporized material and imparting kinetic energy to said ionized vaporized material to transport said ionized vaporized material together with non-ionized vaporized material to a substrate, to thereby deposit said vaporized material on said substrate;
   an accelerating electrode arranged between said ionization region and said substrate for imparting necessary kinetic energy to said ionized vaporized material when said ionized vaporized material reaches said substrate; and
   means for providing said ionized vaporized material of a uniform concentration over a desired area of said substrate or uniformly distributing said ionized vaporized material over said area, said means being arranged between said ionization region and said substrate.

2. The ion beam deposition apparatus as defined in claim 1, wherein said means for providing said ionized vaporized material of a uniform concentration over a desired area of said substrate or uniformly distributing said ionized vaporized material over said area comprises an electrode for accelerating and/or decelerating said ionized vaporized material.

3. The ion beam deposition apparatus as defined in claim 2, wherein said electrode for accelerating and/or decelerating said ionized vaporized material is arranged between said ionization region and said accelerating electrode.

4. The ion beam deposition apparatus as defined in claim 1, wherein said means for providing said ionized vaporized material of a uniform concentration over a desired area of said substrate or uniformly distributing said ionized vaporized material over said area comprises a deflecting electrode for deflecting said ionized vaporized material.

5. The ion beam deposition apparatus as defined in claim 4, said deflecting electrode is arranged between said accelerating electrode and said substrate.

6. The ion beam deposition apparatus as defined in claim 4, wherein said deflecting electrode is arranged between said ionization region and said accelerating electrode.

7. The ion beam deposition apparatus as defined in claim 4, wherein said deflecting electrode comprises a pair of X-axis deflecting electrodes arranged to be opposite to each other and a pair of Y-axis deflecting electrodes arranged to be opposite to each other.

8. The ion beam deposition apparatus as defined in claim 7, wherein said X-axis deflecting electrodes and Y-axis deflecting electrodes are applied thereto voltages of a sine wave of which the phases are different by 90° from each other and the crest values are gradually increased.

* * * * *